(12) United States Patent
Morifusa

(10) Patent No.: US 6,335,925 B1
(45) Date of Patent: *Jan. 1, 2002

(54) TIME DIVISION MULTIPLE ACCESS SYSTEM RADIO EQUIPMENT AND SYNTHESIZER OUTPUT LEVEL ADJUSTING CIRCUIT

(75) Inventor: Hiroshi Morifusa, Saitama (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/024,295

(22) Filed: Feb. 17, 1998

(30) Foreign Application Priority Data

Feb. 18, 1997 (JP) .............................. 9-033705

(51) Int. Cl.$^7$ .............................. H04J 1/16; H04J 1/14; H04L 1/00; H04L 12/26; H04B 7/216
(52) U.S. Cl. ........................ 370/347; 370/252; 370/337; 370/342; 455/103; 455/127; 455/450
(58) Field of Search ................................ 370/347, 321, 370/322, 331, 337, 343, 342; 455/103, 126, 127, 249, 427, 430, 234.1, 226.2, 266, 339; 331/16, 17, 18, 23, 25; 375/345

(56) References Cited

U.S. PATENT DOCUMENTS

| 4,105,948 A | * | 8/1978 | Wolkstein | 331/14 |
| 4,272,729 A | * | 6/1981 | Riley, Jr. | 331/1 |
| 4,602,225 A | * | 7/1986 | Miller et al. | 332/19 |
| 4,968,950 A | * | 11/1990 | Babin et al. | 331/1 A |
| 5,095,542 A | * | 3/1992 | Suematsu et al. | 455/127 |
| 5,175,511 A | * | 12/1992 | Fujiwara | 331/18 |
| 5,207,491 A | * | 5/1993 | Rottinghaus | 331/16 |
| 5,424,688 A | * | 6/1995 | Phillips | 331/16 |
| 5,546,380 A | * | 8/1996 | Tomasi et al. | 370/17 |
| 5,809,420 A | * | 9/1998 | Ichiyanagi et al. | 455/103 |

FOREIGN PATENT DOCUMENTS

| EP | 0 688 108 A2 | 12/1995 |
| WO | WO 97/05697 | 2/1997 |

* cited by examiner

Primary Examiner—Wellington Chin
Assistant Examiner—M. Phan
(74) Attorney, Agent, or Firm—McGuireWoods LLP

(57) ABSTRACT

A time division multiple access (TDMA) system radio equipment and a synthesizer output level adjusting circuit are disclosed for causing output level of synthesizer with frequency fluctuation caused by synthesizer switching to be variable in unnecessary guard time of transmission output and at the time transmission transient response by incorporating voltage variable attenuator into synthesizer output. A TDMA system radio equipment switches to use a synthesizer outputting a plurality of frequencies, comprising a voltage variable attenuator in which attenuation amount of output of the synthesizer changes caused by controlled voltage, a counting means for counting such that attenuation amount of the voltage variable attenuator changes with required time and required inclination based on leading timing at the time for transmission, and a voltage generation means for outputting voltage based on counting of the counting means to change attenuation amount of the voltage variable attenuator, whereby there is controlled such that output level of the synthesizer rises with required inclination before leading timing at the time for transmission, while output level of the synthesizer gravitates with required inclination after trailing timing at the time for transmission.

8 Claims, 3 Drawing Sheets

F I G. 1
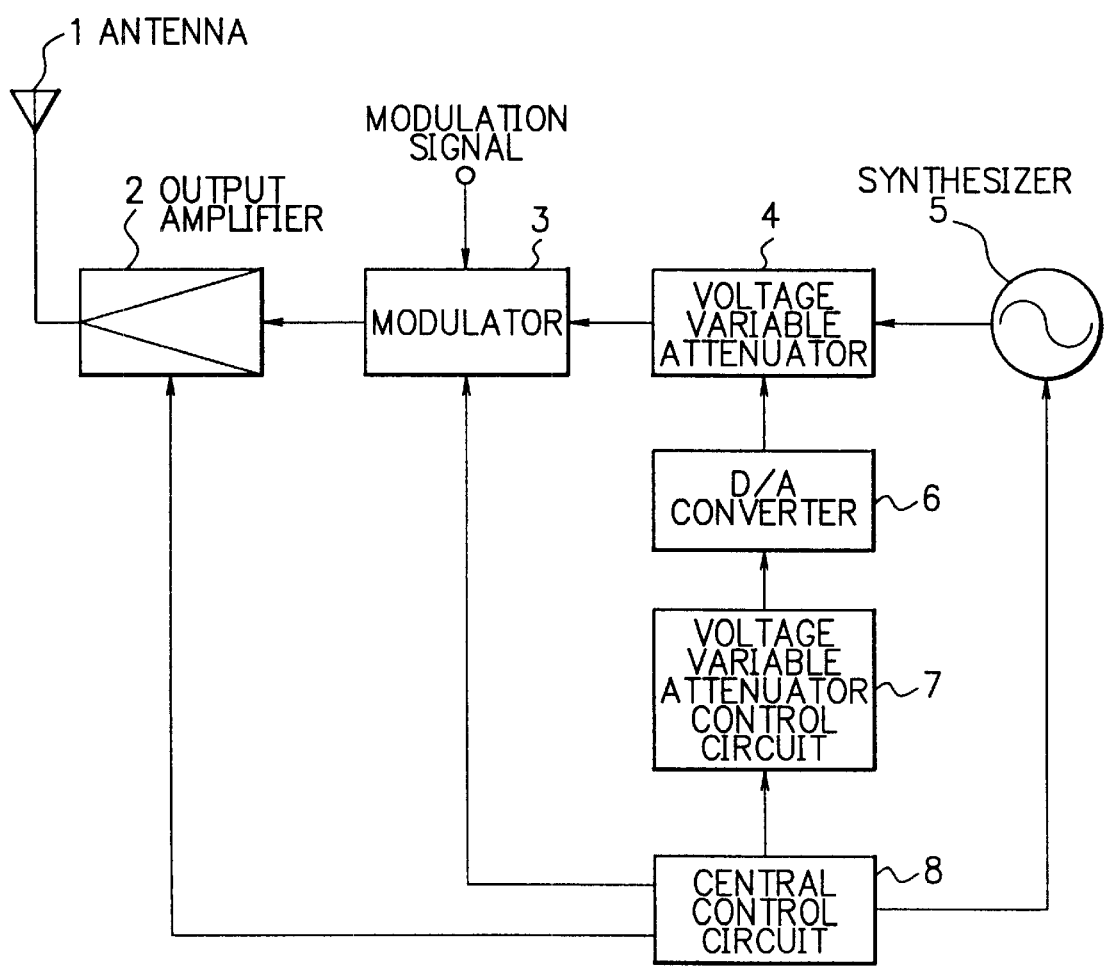

TIME DIVISION MULTIPLE ACCESS SYSTEM RADIO EQUIPMENT AND SYNTHESIZER OUTPUT LEVEL ADJUSTING CIRCUIT

BACKGROUND OF THE INVENTION

The present invention relates to a time division multiple access (hereinafter referring to TDMA) system radio equipment and synthesizer output level adjusting circuit. More to particularly this invention relates a TDMA system radio equipment and a synthesizer output level adjusting circuit which is capable of implementing unwanted frequency emission and unwanted wave suppression at the time when a synthesizer is switched.

DESCRIPTION OF THE PRIOR ART

In a circuit constitution of a conventional radio equipment, an output section of a synthesizer of the radio equipment has a switch circuit which performs output control.

As a conventional radio equipment, for example, the Japanese Patent Application Laid-Open No. HEI 07-066737 discloses a radio equipment. The radio equipment comprises a counting means for counting required time period from the time when switching of output frequency of synthesizer starts to the time when the output frequency of the synthesizer converges on specified frequency fluctuation tolerance, an AND circuit for ANDing an output signal of the counting means and a lock signal outputted from the synthesizer, and a means for controlling make-and-break of the switching circuit using output signal of the AND circuit, wherein it causes unwanted transmission to prevent at the leading time of transmission in an output stage of the synthesizer.

However, in the prior art, the synthesizer outputs an output signal although frequency fluctuation is large at the time of channel switching, so that unwanted frequency is inputted into a modulator. As a result, there is a first problem that adjacent-channel leakage power of transmission output for the TDMA system radio equipment becomes high.

Further, in the prior art, an output of the synthesizer with higher neighborhood noise caused by unwanted frequency component which is generated at the time of channel switching of the synthesizer is inputted directly to the modulator, thereby, there is a second problem that neighborhood noise of transmission output frequency of the TDMA system radio equipment is enlarged.

SUMMARY OF THE INVENTION

In view of the foregoing, it is an object of the present invention for resolving the above-mentioned problems to provide a TDMA system radio equipment and a synthesizer output level adjusting circuit which relates to synthesizer switching circuit of the TDMA system radio equipment causing output level to lower when frequency fluctuation is large at the time to switch the synthesizer, and causing unwanted frequency component to suppress.

According to one aspect of the present invention, for achieving the above-mentioned object, there is provided a synthesizer switching circuit which has a voltage variable attenuator for changing attenuation amount according to an applied voltage causing output level to switch OFF-state at the time to switch synthesizer, and which causes attenuation amount of the voltage variable attenuator to rise or to gravitate with required time and required inclination so as not to come into steep leading/trailing of output level of the synthesizer.

Preferably, there is provided a time division multiple access (TDMA) system radio equipment which uses a synthesizer outputting a plurality of frequencies while switching the synthesizer and which comprises a voltage variable attenuator for changing attenuation amount of a synthesizer output in answer to controlled voltage, a counting means for counting such that the attenuation amount of the voltage variable attenuator changes with required time and required inclination based on leading timing at the time of transmission, and a voltage generating means for generating voltage by which attenuation amount of the voltage variable attenuator is changed based on counting of the counting means, wherein it controls such that output level of the synthesizer rises with required inclination before timing of rising at the time transmission, while output level of the synthesizer gravitates with required inclination after timing of gravitating at the time transmission.

Preferably, there is provided a synthesizer output level adjusting circuit being in use for a synthesizer outputting a plurality of frequencies which synthesizer output level adjusting circuit comprises a voltage variable attenuator which is connected to the synthesizer to receive the plurality of frequencies and whose attenuation amount changes caused by controlled voltage, and a counting means for counting such that the attenuation amount of the voltage variable attenuator changes with required time and required inclination based on leading timing at the time of frequency switching of the synthesizer, wherein it causes the controlled voltage to supply to the voltage variable attenuator based on counting of the counting means, and wherein it causes the controlled voltage to control such that output level of the synthesizer rises with required inclination before leading timing at the time of transmission, while output level of the synthesizer gravitates with required inclination after trailing timing after terminating output of the synthesizer.

As stated above, the synthesizer switching circuit according to the present invention, when frequency fluctuation at the time synthesizer switching is of large value, it causes output level of the synthesizer to lower, further there is no steep leading edge and trailing edge of the output level of the synthesizer thereby it is capable of suppressing unwanted frequency component. For this reason, it is capable of preventing deterioration of transmission output adjacency channel leakage power and suppressing adjacent noise of transmission output.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 1 is circuit constitution view according to the present invention;

DETAILED DESCRIPTION OF THE PREFERRED EMBODIMENT

Figure 2:
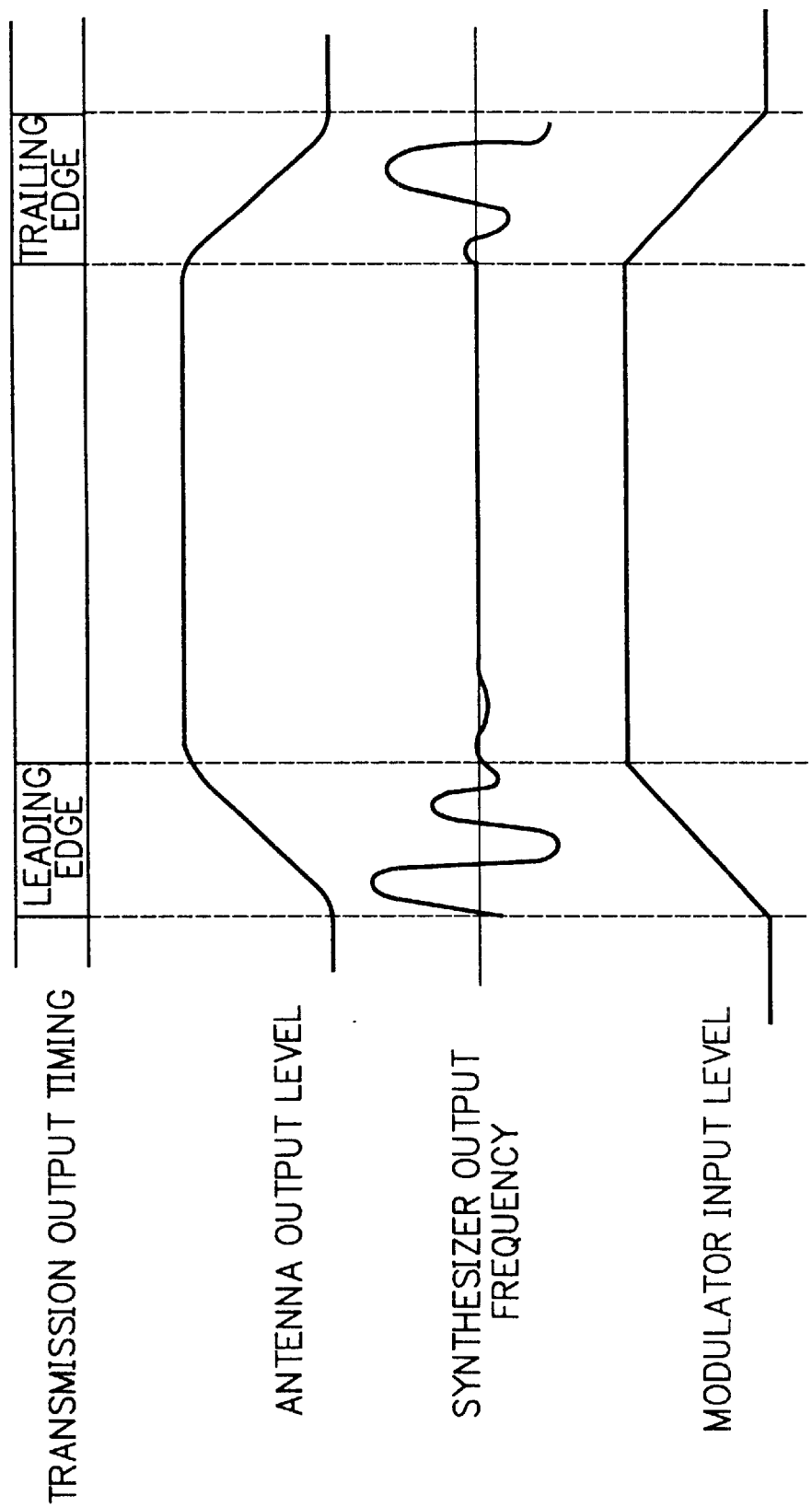
FIG. 2 is a timing chart of respective block of one embodiment according to the present invention.

A preferred embodiment of the present invention will now be described in detail referring to the accompanying drawings.

FIG. 1 is circuit constitution of one embodiment according to the present invention. In FIG. 1, a synthesizer 5 outputs transmission frequency signal corresponding to a plurality of prescribed channels of TDMA system radio equipment. While the synthesizer 5 receives frequency signal which is multiplied by n times based on reference frequency of crystal oscillator using, for example, programmable PLL frequency synthesizer. A voltage variable attenuator dumps output level of the synthesizer 5 to prescribed level in response to analog controlled voltage. The voltage variable attenuator dumps output level of leading edge and trailing edge with required inclination at the time when frequency changes. For example, pin diode attenuation circuit uses pin diode or if possible, transistor attenuator for causing resistance value to change in between drain-source of FET transistor and so forth are in use. Furthermore, a modulator 3 is a circuit for demodulating radio frequency signal of the voltage variable attenuator 4 using modulation signal of digital signal such as DQPSK or ADPCM or the like. An FET switching circuit or an ECL circuit or the like are used as the modulator 3. Moreover, an output amplifier 2 is a circuit for driving the radio frequency signal modulated by the modulator 3 to antenna 1, thus outputting the radio frequency signal to the antenna 1 with prescribed power using transistor.

A D/A converter is a converter for converting digital signal of the voltage variable attenuator control circuit 7 into an analog signal, for supplying controlled voltage to the voltage variable attenuator 4 using analog signal. The voltage variable attenuator control circuit 7 outputs data corresponding to the controlled voltage based on the data from a central control circuit 8. In this case, the voltage variable attenuator control circuit 7 data-converts the controlled voltage into three kinds of voltage of leading voltage with prescribed inclination, trailing voltage and fixed voltage in between, thus outputting converted data to the D/A converter as the digital signal. A central control circuit 8 consists of a CPU which controls whole TDMA system radio equipment, and peripheral circuit and so forth.

Besides, it is suitable that the voltage variable attenuator control circuit 7 is incorporated in the central control circuit 8. Although the modulator 3 is allocated independently, it is also proper that the modulator 3 directly modulates the reference oscillation frequency of the synthesizer 5 in accordance with modulation system.

Furthermore, in the TDMA system radio equipment, signal is subjected to time-division multiplexing in every frequency of respective channels of transmission. PHS is of four slots, and land mobile radiotelephone is of three slots and so forth, namely, signal is transmitted with time division of a plurality of slots, thus transmitting signal while switching channel successively. A reception section of the TDMA system radio equipment functions such that the reception section receives particular slot of specified channel, thus modulating transmission data while constituting mixer by local oscillation frequency which has fixed relationship in terms of oscillation frequency of the synthesizer 5.

Next, operation of the above constitution will be described referring to FIGS. 1, 2, and 3. In this embodiment, there is provided with the voltage variable attenuator control circuit 7 which counts so as to change attenuation amount of the voltage variable attenuator 4 with prescribed time and prescribed inclination from prescribed timing based on timing of transmission leading/trailing in transmission output timing of FIG. 2. There is provided with the voltage variable attenuator 4 whose attenuation amount is changed in accordance with output voltage of the D/A converter 6 based on the data of the voltage variable attenuator control circuit 7. An output level of the radio frequency of the modulator 3 is controlled so as to come to be prescribed time/prescribed inclination such as input level of the modulator of FIG. 2. Furthermore, the output which is inputted to modulator 3 to be modulated is amplified by the output amplifier 2, thus being outputted from the antenna 1.

Figure 3:
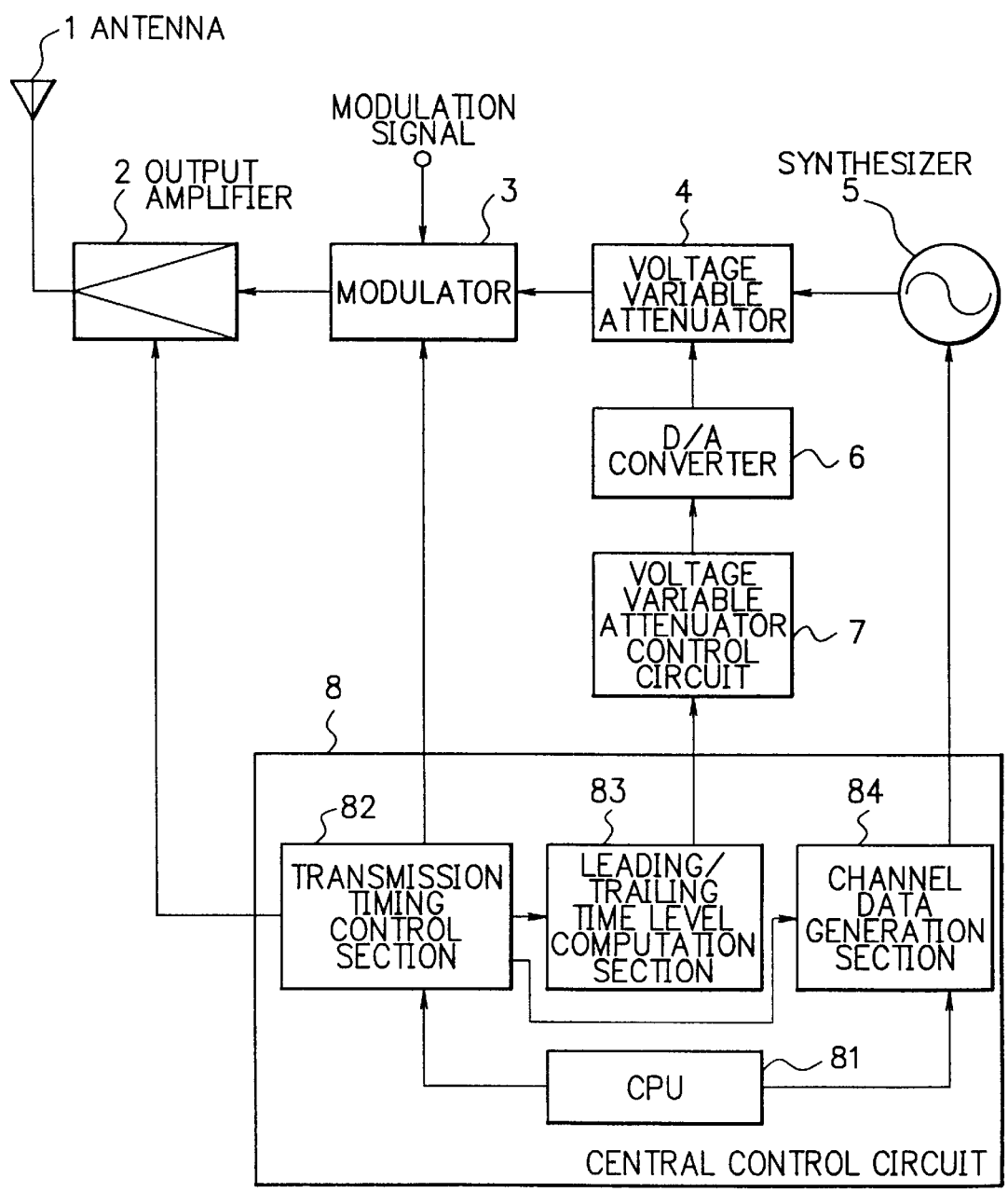
FIG. 3 is a block diagram showing a central control circuit of FIG. 1.

FIG. 3 is a block diagram showing a central control circuit of FIG. 1. In FIG. 3, the central control circuit 8 comprises a central processing unit (CPU) 81 which controls all of radio equipment including whole peripheral equipments, for calculating time division, and for determinating transmission/reception frequency and so forth in the DTMA system, a transmission timing control section 82 for controlling data transmission timing of frequency being in use for synthesizer, for controlling start/end of control variable resistance attenuator, and for controlling power-supply of respective devices of TDMA system radio equipment, a leading/trailing time level computation section 83 for computing the leading/trailing time level, namely leading edge of input of the modulator 3 being determined, and a channel data generation section 84 for generating information such as required frequency for locking the synthesizer and so forth. The leading/trailing time level computation section 83 calculates that it causes attenuation amount to change to required level during fixed time interval, thus transmitting the information to the voltage variable control circuit 7.

When the TDMA system radio equipment is a portable telephone, the central control circuit 8 implements computation of leading time and leading level with prescribed counting in accordance with the transmission output timing shown in FIG. 2 in order to transmit a directed slot and transmission frequency from a base station. While when the TDMA system radio equipment is an exchange with a base station, the central control circuit 8 implements computation of leading time and leading level with prescribed counting in accordance with the transmission output timing shown in FIG. 2 in order to transmit the data using special channel due to procedure defined beforehand for effective application of communication system. Thus, the central control circuit 8 implements power control for burst (sudden enlargement of transmission signal intensity) of the output amplifier 2. The central control circuit 8 transmits a modulation data to the modulator 3. The central control circuit 8 transmits frequency data in use and timing data of burst of leading and trailing to the synthesizer 5. The central control circuit 8 transmits timing data of the burst to the voltage variable attenuator control circuit 7. The voltage variable attenuator control circuit 7 outputs the data while converting the timing data into voltage data in answer to the controlled voltage in accordance with the data, thus outputting to the D/A converter 6, so that it causes controlled voltage to supply to the voltage variable attenuator 4. Thus as shown in FIG. 2, during the period of leading edge or trailing edge when the output frequency of synthesizer 5 is swung, the output of the antenna 1 is outputted with required inclination of leading edge and with required inclination of trailing edge.

At this time, it is no problem if inclination of leading edge is different from inclination of trailing edge. The inclination of leading edge and the inclination of trailing edge are counted to be established in answer to fluctuation of frequency in leading edge and trailing edge of the synthesizer 5.

The frequency is tried to make the most stable by the synthesizer 5 using the PLL frequency synthesizer circuit, however, of course it is capable of shortening latch up time of low pass filter of the PLL circuit. Also it causes the latch up time to shorten while implementing characteristic change of the low pass filter in answer to transmission frequency due to control of the central control circuit 8. It is capable of changing the inclination of leading edge and the inclination of the trailing edge in answer thereto.

As described above, in accordance with the present invention, the voltage variable attenuator is incorporated into the synthesizer outputting means to control output level of the synthesizer to come to be low value when frequency deviation is large, thus suppressing unwanted frequency output, thereby, it is capable of suppressing output level of the synthesizer when frequency deviation is large at the time of frequency change of the synthesizer. As a result, it is capable of suppressing adjacent channel leakage power of the transmission output.

As described above, in accordance with the present invention, the voltage variable attenuator is incorporated into the synthesizer outputting means to control the output level of the synthesizer so as not to come to be steep leading edge/trailing edge by causing the output level to change with time control, thus suppressing unwanted frequency component of the output of the synthesizer, thereby, it is capable of suppressing unwanted frequency component at the time when synthesizer is switched, so that it is capable of suppressing noise at neighborhood of transmission output. Further, that is to say, variable attenuator is incorporated into synthesizer outputting means so that it is capable of causing the output level of the synthesizer to be variable, which output level of the synthesizer is frequency-fluctuated by switching of the synthesizer at guard time without transmission output and at the time burst transmission transient response, thus it is capable of generating leading edge and trailing edge under the required control. Consequently, it is capable of implementing frequency switching with calculated short time as a result, thus frequency management becomes easy.

Furthermore, it causes the output level of the synthesizer of synthesizer level timing to control to trapezoidal waveform by a variable resistance attenuator, thereby, it is capable of suppressing unwanted waveform at the time frequency switching. Moreover it causes steep level fluctuation at the time leading edge and trailing edge to suppress so that it is capable of simultaneously preventing spreading deterioration of the transmission frequency.

While preferred embodiments of the invention have been described using specific terms, such description is for illustrative purpose only, and it is to be understood that changes and variations may be made without departing from the spirit or scope of the following claims.

What is claimed is:

1. A time division multiple access (TDMA) system radio equipment which uses a synthesizer outputting a plurality of frequencies while switching said synthesizer, comprising:
   a voltage variable attenuator for changing attenuation amount of an output of a synthesizer in response to a controlled voltage;
   a counting means for counting such that said attenuation amount of said voltage variable attenuator changes with required time and required inclination on a leading edge of transmission; and
   a voltage generation means for generating voltage by which attenuation amount of said voltage variable attenuator is changed based on counting of said counting means,
   wherein an output level of said synthesizer rises with required inclination on said leading edge of said transmission, and said output level of said synthesizer falls with required inclination on a trailing edge of said transmission.

2. A synthesizer output level adjusting circuit for a synthesizer outputting a plurality of frequencies comprising:
   a voltage variable attenuator which is connected to said synthesizer to receive said plurality of frequencies and whose attenuation amount changes caused by controlled voltage; and
   a counting means for counting such that said attenuation amount of said voltage variable attenuator changes with required time and required inclination at a transmission leading edge when said synthesizer switches frequencies,
   wherein said voltage variable attenuator attenuates, based on counting of said counting means, an output level of said synthesizer to rise with required inclination at said transmission leading edge, and said output level of said synthesizer falls with required inclination at a transmission trailing edge of said output of said synthesizer.

3. A method for switching output level of synthesizer comprising the steps of:
   changing attenuation amount of a synthesizer output in response to controlled voltage;
   counting such that said attenuation amount changes with required time and required inclination on a leading edge of a transmission; and
   generating a voltage by which said attenuation amount is changed based on said counting,
   wherein said attenuation amount causes an output level of said synthesizer to rise with required inclination on said leading edge of transmission, and causes said output level of said synthesizer to fall with required inclination on a trailing edge of said transmission.

4. A method for switching output level of synthesizer comprising the steps of:
   connecting a voltage variable attenuator to a synthesizer to receive a plurality of frequencies and whose attenuation amount changes caused by controlled voltage; and
   counting such that said attenuation amount of said voltage variable attenuator changes with required time and required inclination on a leading transmission edge when frequency switching said synthesizer,
   wherein said counting causes said controlled voltage to be supplied to said voltage variable attenuator based on said counting such that an output level of said synthesizer rises with required inclination on said leading transmission edge, and said output level of said synthesizer fall s with required inclination at a trailing transmission edge.

5. A radio frequency synthesizer adjusting circuit for suppressing unwanted frequency emissions when switching frequencies, comprising:
   a frequency synthesizer capable of being switched to supply a plurality of modulation frequencies;
   a modulator for receiving said modulation frequencies from said frequency synthesizer;
   a variable attenuator connected between said frequency synthesizer and said modulator for attenuating said modulation frequencies prior to reaching said modulator; and
   a controller for adjusting an attenuation level of said variable attenuator when said frequency synthesizer switches frequencies for a transmission, said controller changing said attenuation level from a low level to a high level during a leading edge of said transmission to suppress unwanted frequency emissions and changing said attenuation level from said high level to said low level during a trailing edge of said transmission to suppress unwanted frequency emissions.

6. A radio frequency synthesizer adjusting circuit as recited in claim 5, further comprising:

a counting means for counting a time period comprising said leading edge and said trailing edge; and a digital to analog converter for converting an output of said counting means into a voltage signal to control said attenuation level of said variable attenuator.

7. A radio frequency synthesizer adjusting circuit as recited in claim 5 wherein said frequency synthesizer is for a time division multiple access (TDMA) radio system.

8. A radio frequency synthesizer adjusting circuit for suppressing unwanted frequency emissions when switching frequencies, comprising:

a frequency synthesizer capable of being switched to supply a plurality of modulation frequencies;

a modulator for receiving said modulation frequencies from said frequency synthesizer; and a variable attenuator connected between said frequency synthesizer and said modulator for attenuating said modulation frequencies prior to said frequency synthesizer reaching steady state when said frequency synthesizer is switched.

* * * * *